(12) United States Patent
Heo et al.

(10) Patent No.: US 9,705,014 B2
(45) Date of Patent: Jul. 11, 2017

(54) METHOD OF FORMING ELECTRODE, ELECTRODE MANUFACTURED THEREFROM AND SOLAR CELL

(71) Applicant: SAMSUNG SDI CO., LTD., Yongin-si, Gyeonggi-do (KR)

(72) Inventors: Ryunmin Heo, Suwon-si (KR); Chul-Kyu Kim, Suwon-si (KR); Chanwoong Na, Suwon-si (KR); Jaejoon Shim, Suwon-si (KR); Sanghoon Yoo, Suwon-si (KR); Wonhee Lee, Suwon-si (KR); Jungchul Lee, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/238,797

(22) Filed: Aug. 17, 2016

(65) Prior Publication Data
US 2017/0162727 A1 Jun. 8, 2017

(30) Foreign Application Priority Data

Dec. 2, 2015 (KR) ........................ 10-2015-0170736

(51) Int. Cl.
*H01L 21/00* (2006.01)
*H01L 31/0224* (2006.01)
(Continued)

(52) U.S. Cl.
CPC ...... *H01L 31/022425* (2013.01); *C03C 3/062* (2013.01); *C03C 3/122* (2013.01);
(Continued)

(58) Field of Classification Search
CPC ............ H01L 31/0368; H01L 31/1864; H01L 31/02168; H01L 31/0682
See application file for complete search history.

(56) References Cited

U.S. PATENT DOCUMENTS 8,226,856 B2 7/2012 Carroll et al.
2011/0308601 A1 12/2011 Kim et al.
(Continued)

FOREIGN PATENT DOCUMENTS

CN 104087194 A 10/2014
JP 08-148446 A 6/1996
(Continued)

OTHER PUBLICATIONS

Taiwanese Search Report dated Feb. 16, 2017, of the corresponding Taiwanese Patent Application No. 105125528.

*Primary Examiner* — Bradley K Smith
(74) *Attorney, Agent, or Firm* — Lee & Morse, P.C.

(57) ABSTRACT

A method of forming an electrode, an electrode for a solar cell manufactured, and a solar cell, the method including forming a pattern of a finger electrode by: coating a composition for forming a first electrode that includes a conductive powder, an organic vehicle, and a first glass frit that is free of silver and phosphorus, and drying the coated composition for forming a first electrode; forming a pattern of a bus electrode by: coating a composition for forming a second electrode that includes a conductive powder, an organic vehicle, and a second glass fit that includes silver and phosphorus, and drying the coated composition for forming a second electrode; and firing the resultant patterns.

10 Claims, 3 Drawing Sheets

(51) Int. Cl.
*H01L 31/0368* (2006.01)
*H01L 31/068* (2012.01)
*H01L 31/0216* (2014.01)
*H01L 31/18* (2006.01)
*C09D 5/24* (2006.01)
*C03C 8/18* (2006.01)
*C03C 8/08* (2006.01)
*C03C 8/04* (2006.01)
*C03C 4/14* (2006.01)
*C03C 3/16* (2006.01)
*C03C 3/12* (2006.01)
*C03C 3/062* (2006.01)

(52) U.S. Cl.
CPC .................. *C03C 3/16* (2013.01); *C03C 4/14* (2013.01); *C03C 8/04* (2013.01); *C03C 8/08* (2013.01); *C03C 8/18* (2013.01); *C09D 5/24* (2013.01); *H01L 31/02168* (2013.01); *H01L 31/0368* (2013.01); *H01L 31/0682* (2013.01); *H01L 31/1864* (2013.01)

(56) References Cited

U.S. PATENT DOCUMENTS

| | | | |
|---|---|---|---|
| 2016/0284892 A1* | 9/2016 | Jang | H01L 31/022425 |
| 2017/0005218 A1* | 1/2017 | Chang | H01L 31/02167 |
| 2017/0012148 A1* | 1/2017 | Lee | H01L 31/02167 |

FOREIGN PATENT DOCUMENTS

| | | |
|---|---|---|
| JP | 2010-034161 A | 2/2010 |
| JP | 2014-116261 A | 6/2014 |
| KR | 10-2012-0077439 A | 7/2012 |
| KR | 10-2013-0117707 A | 10/2013 |
| KR | 10-2014-0063716 A | 5/2014 |
| TW | 201240128 | 10/2012 |
| TW | 201532077 A | 8/2015 |

* cited by examiner

METHOD OF FORMING ELECTRODE, ELECTRODE MANUFACTURED THEREFROM AND SOLAR CELL

CROSS-REFERENCE TO RELATED APPLICATION

Korean Patent Application No. 10-2015-0170736, filed on Dec. 2, 2015, in the Korean Intellectual Property Office, and entitled: "Method of Forming Electrode, Electrode Manufactured Therefrom and Solar Cell," is incorporated by reference herein in its entirety.

BACKGROUND

1. Field

Embodiments relate to a method of forming an electrode, an electrode manufactured therefrom, and a solar cell.

2. Description of the Related Art

Solar cells may generate electrical energy using the photovoltaic effect of a p-n junction which may convert photons of light, e.g., sunlight, into electricity. In the solar cell, front and rear electrodes may be formed on front and rear surfaces of a semiconductor substrate (a semiconductor wafer) with the p-n junction, respectively. Then, the photovoltaic effect of the p-n junction may be induced by sunlight entering the substrate and electrons generated by the photovoltaic effect of the p-n junction may provide an electric current to the outside through the electrodes.

The electrodes of the solar cell may be formed with predetermined patterns on the surface of the wafer by coating, patterning, and firing an electrode composition.

SUMMARY

Embodiments are directed to a method of forming an electrode, an electrode manufactured therefrom, and a solar cell.

The embodiments may be realized by providing a method of forming an electrode, the method including forming a pattern of a finger electrode by: coating a composition for forming a first electrode that includes a conductive powder, an organic vehicle, and a first glass frit that is free of silver and phosphorus, and drying the coated composition for forming a first electrode; forming a pattern of a bus electrode by: coating a composition for forming a second electrode that includes a conductive powder, an organic vehicle, and a second glass fit that includes silver and phosphorus, and drying the coated composition for forming a second electrode; and firing the resultant patterns.

The composition for forming the first electrode may include about 60 wt % to about 95 wt % of the conductive powder, about 0.5 wt % to about 20 wt % of the first glass frit, and a balance amount of the organic vehicle.

The composition for forming the second electrode may include about 60 wt % to about 95 wt % of the conductive powder, about 0.5 wt % to about 20 wt % of the second glass fit, and a balance amount of the organic vehicle.

The second glass frit may include about 0.1 mol % to about 5 mol % of silver, and about 0.1 mol % to about 3 mol % of phosphorus, all mol % being based on a total amount of the second glass fit.

The second glass frit may further include tellurium and lithium.

The second glass frit may include about 30 mol % to about 60 mol % of tellurium, and about 3 mol % to about 20 mol % of lithium, all mol % being based on a total amount of the second glass frit.

The second glass frit may have a mole ratio of tellurium to lithium of about 80:20 to about 95:5.

The second glass fit may further include bismuth, lead, or a combination thereof.

The embodiments may be realized by providing an electrode for a solar cell manufactured according to the method of an embodiment.

The embodiments may be realized by providing a solar cell including the electrode according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
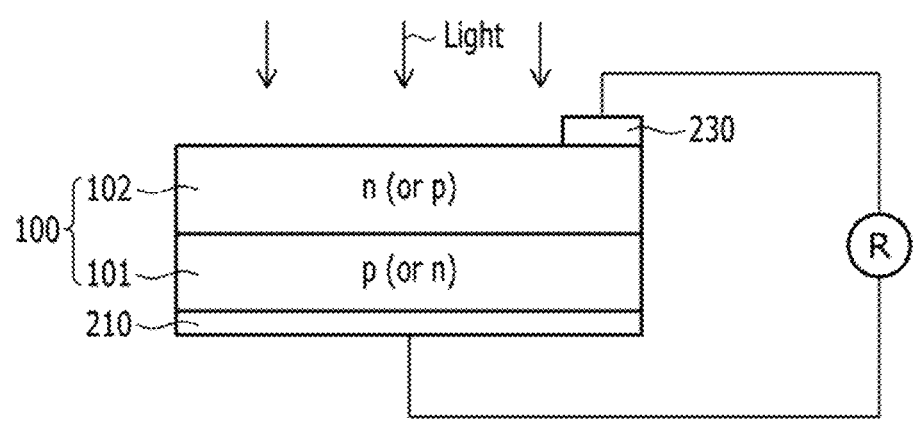
FIG. 1 illustrates a schematic view showing the structure of a solar cell according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "combination thereof" refers to a mixture, an alloy, or a solid solution compound of two or more components.

As used herein, the term "free of" refers to inclusion of a corresponding component in an amount of less than about 0.1 mol %.

According to an embodiment, a method of forming an electrode may include coating a composition for forming a first electrode followed drying the same to form a pattern of a finger electrode. The composition for forming a first electrode may include, e.g., a conductive powder, an organic vehicle, and a first glass frit (that is free of silver (Ag) and phosphorus (P)).

The method may further include coating a composition for forming a second electrode followed by drying the same to form a pattern of a bus electrode. The composition for forming a second electrode may include, e.g., a conductive powder, an organic vehicle, and a second glass frit (that includes silver (Ag) and phosphorus (P)).

The method may further include firing the resultant (e.g., the pattern of a finger electrode and the pattern of the bus electrode).

Hereinafter, a method of forming an electrode is illustrated in detail.

[Preparation of Compositions for Forming First Electrode and Second Electrode]

A composition for forming a first electrode may be prepared by mixing, e.g., a conductive powder, a first glass frit (that is free of silver (Ag) and phosphorus (P)), and an organic vehicle. A composition for forming a second electrode may be prepared by mixing, e.g., a conductive powder, a second glass frit (that includes silver (Ag) and phosphorus (P)), and an organic vehicle.

The conductive powder may be a metal powder. The metal powder may include, e.g., silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt (Co), zirconium (Zr), iron (Fe), tungsten (W), tin (Sn), chromium (Cr), manganese (Mn), or the like.

A particle size of the conductive powder may be nanometer or micrometer scale. For example, the conductive powder may have a particle size of dozens to several hundred nanometers, or several to dozens of micrometers. In an implementation, the conductive powder may be a mixture of two or more types of silver powders having different particle sizes.

The conductive powder may have a particle shape of, e.g., a spherical shape, a sheet-shape, or an amorphous shape. In an implementation, the conductive powder may have an average particle diameter (D50) of about 0.1 μm to about 10 μm, e.g., about 0.5 μm to about 5 μm. The average particle diameter may be measured using, e.g., a Model 1064D (CILAS Co., Ltd.) equipment after dispersing the conductive powder in isopropyl alcohol (IPA) at room or ambient temperature (e.g., about 20° C. to about 25° C.) for 3 minutes via ultrasonication. Within this range of average particle diameter, the composition may provide low contact resistance and low line resistance.

The conductive powder may be present in an amount of about 60 wt % to about 95 wt %, based on 100 wt % of the composition for forming a first electrode or the composition for forming a second electrode. In an implementation, the conductive powder may be present in an amount of about 70 wt % to about 90 wt %. Within this range, deterioration in conversion efficiency due to an increase in resistance may be reduced and/or prevented, and hard formation of paste caused by a relative decrease of an organic vehicle may also be reduced and/or prevented.

The first glass frit and the second glass frit may help enhance adhesion between the conductive powder and the substrate and may help form silver crystal grains in an emitter region by etching an anti-reflection layer and melting the conductive powder so as to reduce contact resistance during a firing process of the first and second composition for forming an electrode. During the firing process, the first glass frit and the second glass frit may be softened and may decrease the firing temperature.

The first glass frit may be free of silver (Ag) and phosphorus (P) components. Maintaining the first glass frit free of silver (Ag) and phosphorus (P) components may help ensure that series resistance is not increased.

The first glass frit may include at least one of lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and/or aluminum (Al).

In an implementation, the first glass frit may be a glass frit including bismuth (Bi) and tellurium (Te) components.

The first glass frit may include a bismuth (Bi) component in a range of about 20 to about 80 mol % and a tellurium (Te) component in a range of about 20 to about 80 mol %, based on the total amount (e.g., total number of moles of components) of the first glass frit. Within the ranges, excellent conversion efficiency of a solar cell and adhesion strength of an electrode pattern may be simultaneously secured.

The second glass frit may include, e.g., silver (Ag) and phosphorus (P) components, and thus may help minimize an open-circuit voltage ($V_{oc}$) loss generated due to insufficient contact between an electrode and a substrate, as well as to help minimize a series resistance ($R_s$) increase. In an implementation, the series resistance ($R_s$) increase may be minimized by improving conductivity of the electrode due to Ag ions derived from the second glass frit.

In an implementation, the second glass frit may include the silver (Ag) in a range of about 0.1 to about 5 mol %, e.g., about 0.1 to about 3 mol %, and the phosphorus (P) in a range of about 0.1 to about 3 mol %, e.g., about 0.1 to about 1.5 mol %. Within the ranges, an open-circuit voltage ($V_{oc}$) loss generated due to an insufficient contact between an electrode and a substrate and a series resistance ($R_s$) increase may both be minimized.

The silver (Ag) and phosphorus (P) components in the second glass frit may be derived from, e.g., silver metaphosphate ($AgPO_3$), silver orthophosphate ($Ag_3PO_4$), silver pyrophosphate ($Ag_4P_2O_7$), hexafluorophosphoric acid, or a combination thereof.

In an implementation, the second glass frit may also include at least one of lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn) and/or aluminum (Al).

In an implementation, the second glass frit may be a glass frit including tellurium (Te) and lithium (Li) components.

The second glass frit may include a tellurium (Te) component in a range of about 30 to about 60 mol %, e.g., in a range of about 35 to about 55 mol %, and a lithium (Li) component in a range of about 3 to about 20 mol %, e.g., in a range of about 5 to about 15 mol %, based on the total amount (e.g., total number of moles of components) of the second glass frit.

In the second glass frit, a mole ratio of tellurium (Te) and lithium (Li) may be about 80:20 to about 95:5. Within the range, excellent efficiency of the solar cell and adhesion strength of an electrode pattern may be simultaneously secured.

In an implementation, the second glass frit may further include bismuth (Bi), lead (Pb), or a combination thereof, e.g., other than (e.g., in addition to) the silver (Ag), the phosphorus (P), the tellurium (Te), and/or the lithium (Li).

The first glass fit and second glass fit may be prepared from oxides of the elements by a suitable method. For example, the oxides of the elements may be obtained by mixing the oxides of the metal elements in a predetermined ratio, melting the mixture, quenching the resultant, and then pulverizing the quenched product. Mixing may be performed using a ball mill or a planetary mill. The melting may be performed at about 700° C. to about 1,300° C., and the quenching may be performed at room or ambient temperature (e.g., about 24° C. to about 25° C.). The pulverizing may be performed using a disk mill or a planetary mill without limitation.

In an implementation, the first glass frit and the second glass fit may have each average particle diameter (D50) of about 0.1 μm to about 10 μm.

In an implementation, the first glass frit and second glass frit may have a spherical shape or an amorphous shape.

In an implementation, the first glass fit may be included in an amount of about 0.5 to about 20 wt %, based on 100 wt % of the composition for forming a first electrode. In an implementation, the second glass frit may be included in an amount of about 0.5 to about 20 wt %, based on 100 wt % of the composition for forming a second electrode. Within the range, adhesion strength of the electrode pattern may be improved without deteriorating electrical characteristics of an electrode.

The organic vehicle may help impart suitable viscosity and rheological characteristics for printing to the composition for forming a first electrode and composition for forming a second electrode through mechanical mixing with the inorganic component of the electrode composition. The organic vehicle may include, e.g., an organic binder and a solvent.

The organic binder may include acrylate-based resins or cellulose-based resins, e.g., ethyl cellulose. In an implementation, the organic binder may, e.g., ethyl hydroxyethylcellulose, nitrocellulose, a mixture of ethylcellulose and phenolic resins, alkyd resins, phenol-based resins, acrylate ester-based resins, xylene-based resins, polybutene-based resins, polyester-based resins, urea-based resins, melamine-based resins, vinyl acetate-based resins, wood rosin, or polymethacrylates of alcohols.

The organic binder may have a weight average molecular weight (Mw) of about 30,000 to about 200,000 g/mol, e.g., about 40,000 to about 150,000 g/mol. When the weight average molecular weight (Mw) is within the range, an excellent effect in term of printability may be obtained.

The solvent may include, e.g., hexane, toluene, Texanol (2,2,4-trimethyl-1,3-pentanediol monoisobutyrate), methyl cellosolve, ethyl cellosolve, cyclohexanone, butyl cellosolve, aliphatic alcohol, butyl carbitol(diethylene glycol monobutyl ether), dibutyl carbitol(diethylene glycol dibutyl ether), butyl carbitol acetate(diethylene glycol monobutyl ether acetate), propylene glycol monomethyl ether, hexylene glycol, terpineol, methylethylketone, benzylalcohol, gammabutyrolactone, ethyllactate, or a combination thereof.

The organic vehicle may be present in a balance amount of the composition. In an implementation, the organic vehicle may be present in an amount of, e.g., about 1 wt % to about 30 wt % or 5 to 15 wt %, based on 100 wt % of the composition for forming a first electrode or the composition for forming a second electrode. Within the range, excellent continuous printing may be secured.

The composition for forming a first electrode or composition for forming a second electrode may further include an additive, as desired, e.g., to enhance flow properties, process properties, and stability, in addition to the above constituent elements. The additives may include, e.g., a surface-treatment agent, a dispersing agent, a thixotropic agent, a plasticizer, a viscosity stabilizer, an antifoaming agent, a pigment, an ultraviolet (UV) stabilizer, an antioxidant, a coupling agent, or the like. The additive may be used alone or as mixtures thereof. In an implementation, the additive may be present in an amount of, e.g., about 0.1 to about 5 wt %, based on 100 wt % of the composition for forming a first electrode or composition for forming a second electrode.

[Manufacture of Electrode]

The composition for forming a first electrode may be coated with or in a predetermined pattern on a surface of a substrate and then dried, forming a finger electrode pattern.

Then, the composition for forming a second electrode may be coated on the substrate (having the finger electrode pattern thereon) and then dried, forming a bus electrode pattern.

In an implementation, the compositions for forming first and second electrodes may each independently be coated using a suitable method, e.g., screen printing, gravure Offset, rotary screen printing, lift-off, or the like.

The electrode patterns formed of the compositions for forming first and second electrodes may be fired, obtaining an electrode. The firing may be performed at about 400° C. to about 980° C., e.g., about 700° C. to about 980° C. In an implementation, the electrode may have an aspect ratio of about 0.2 to about 0.35 and/or a thickness of about 15 μm to about 30 μm.

According to another embodiment, a solar cell including the electrode may be provided. Referring to FIG. 1, a solar cell according to one embodiment is described.

FIG. 1 illustrates a schematic view showing the structure of the solar cell according to one embodiment.

Referring to FIG. 1, a rear electrode 210 and a front electrode 230 may be formed by printing an electrode composition on a substrate 100 including a p layer (or an n layer) 101 and an n layer (or a p layer) 102 as an emitter and then firing.

For example, the electrode composition may be print-coated on the rear side of the substrate 100 and heat-treated at about 200° C. to about 400° C. for about 10 to about 60 seconds to perform a prior preparation step for the rear electrode.

Forming front electrode 230 may include a pretreatment step that includes coating the composition for forming a first electrode and drying to form a finger electrode pattern and then, coating the composition for forming a second electrode and drying to form a bus electrode pattern.

Then, the rear electrode 210 and the front electrode 230 may be formed by firing at about 400° C. to about 980° C., for example, about 700° C. to about 980° C. for about 30 seconds to about 210 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation Example: Preparation of Composition for Forming Electrode

Preparation Example 1

A composition for forming an electrode was prepared by sufficiently dissolving 1 wt % of ethyl cellulose (Dow Chemical Company, STD4) in 6.7 wt % of terpineol (Nippon Terpine) at 60° C., adding 90 wt % of spherically-shaped silver powder having an average particle diameter of 2.0 μm (Dowa Hightech CO. LTD., AG-5-11F, 3-11F) and 2.3 wt % of a glass frit A having an average particle diameter of 2.0 μm (and a composition as described in Table 1, below) thereto, and evenly mixing them, and mix-dispersing the mixture with a three roll kneader.

Preparation Example 2

A composition for forming an electrode was prepared according to the same method as Preparation Example 1 except for using a glass frit B (having a composition as described in Table 1) instead of the glass frit A.

Preparation Example 3

A composition for forming an electrode was prepared according to the same method as Preparation Example 1 except for using a glass frit C (having a composition as described in Table 1) instead of the glass frit A.

Preparation Example 4

A composition for forming an electrode was prepared according to the same method as Preparation Example 1 except for using a glass frit D (having a composition as described in Table 1) instead of the glass frit A.

TABLE 1

| | Ag | P | Te | Bi | Zn | Li | Si | W | Mg |
|---|---|---|---|---|---|---|---|---|---|
| | | | | | (unit: mol %) | | | | |
| glass frit A | — | — | 43.9 | 8.6 | 14.4 | 12.2 | 11.8 | 9.1 | — |
| glass frit B | — | — | 58.8 | 5.0 | 14.2 | 12.8 | — | 9.2 | — |
| glass frit C | 0.8 | 0.4 | 48.6 | 4.4 | 12.5 | 12.6 | — | 6.2 | 14.5 |
| glass frit D | 1.6 | 0.8 | 53.1 | 4.8 | 13.7 | 12.7 | — | 5.4 | 7.9 |

(Note: Contents (mol %) of Table 1 are based on oxides including the corresponding elements)

Manufacture of Solar Cell

Comparative Example 1

An aluminum paste was printed on a rear side of a multi crystalline wafer obtained by texturing the front side of a wafer (a p type wafer doped with boron), forming an n$^+$ layer with POCl$_3$, and an anti-reflection coating layer with silicon nitride (SiNx:H) thereon, followed by drying it at about 300° C., and then the composition for forming an electrode according to Preparation Example 1 was screen-printed on the front side of the multi crystalline wafer followed by drying it at about 300° C. to form finger electrode and bus electrode patterns. A cell manufactured in the above process was fired in a belt-type furnace at 940° C. to obtain a test cell.

Comparative Example 2

A test cell was manufactured according to the same method as Comparative Example 1 except for using the composition for forming an electrode according to Preparation Example 2 instead of the composition for forming an electrode according to Preparation Example 1 to form finger electrode and bus electrode patterns.

Comparative Example 3

A test cell was manufactured according to the same method as Comparative Example 1 except for using the composition for forming an electrode according to Preparation Example 3 instead of the composition for forming an electrode according to Preparation Example 1 to form finger electrode and bus electrode patterns.

Example 1

An aluminum paste was printed on the rear side of a multi crystalline wafer obtained by texturing the front side of a wafer (a p type wafer doped with boron), forming an n$^+$ layer with POCl$_3$, and an anti-reflection coating layer with silicon nitride (SiNx:H) thereon, followed by drying it at about 300° C., and then the composition for forming an electrode according to Preparation Example 1 was screen-printed on the front side of the multi crystalline wafer followed by drying it at about 300° C. to form a finger electrode pattern. On the dried finger electrode pattern, the composition for forming an electrode according to Preparation Example 3 was screen-printed and dried at about 300° C. to form a bus electrode pattern. A cell obtained in the above process was fired in a belt-type furnace at 940° C. to manufacture a test cell.

Example 2

A test cell was manufactured according to the same method as Example 1 except for using the composition for forming an electrode according to Preparation Example 4 instead of the composition for forming an electrode according to Preparation Example 3.

Figure 2:
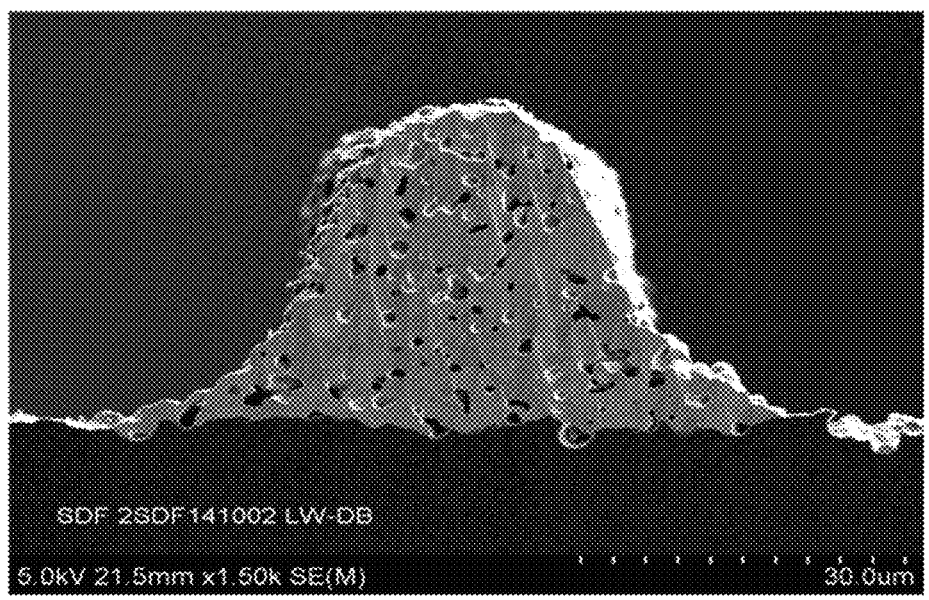
FIG. 2 illustrates a scanning electron microscope (SEM) image of a front electrode according to Example 1.

The electrode patterns after firing according to Comparative Examples 1 to 3 and Examples 1 and 2 were examined through a scanning electron microscope. FIG. 2 illustrates a scanning electron microscope image showing the front electrode according to Example 1 and FIG. 3 illustrates a scanning electron microscope image showing the front electrode according to Comparative Example 1.

Figure 3:
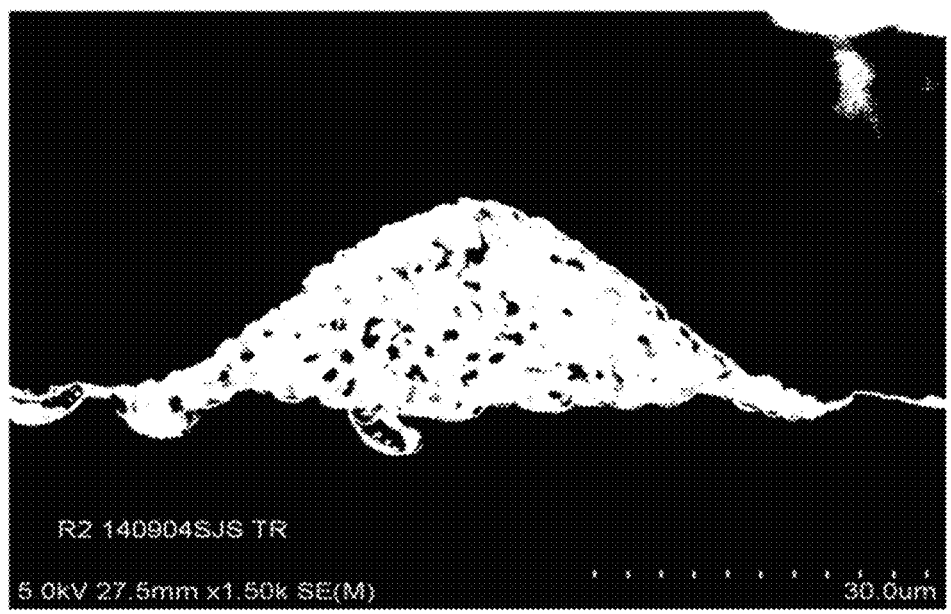
FIG. 3 illustrates a SEM image showing a front electrode according to Comparative Example 1.

Referring to FIGS. 2 and 3, the front electrode of Example 1 had a thickness of 23 μm and a line width of 67 μm, and the front electrode of Comparative Example 1 had a thickness of 18 μm and a line width of 75 μm. Accordingly, the electrode of Example 1 was thicker and patterned with a higher aspect ratio than the electrode of Comparative Example 1.

Electrical characteristics ($I_{sc}$, $V_{oc}$, $R_s$, fill factor (FF, %), conversion efficiency (Eff., %)) of the test cells according to Comparative Examples 1 to 3 and Examples 1 and 2 were measured by using a solar cell efficiency measuring equipment (Pasan CT-801, MB Systems Co. Ltd.). The results are provided in Table 2.

TABLE 2

| | $I_{sc}$ (A) | $V_{oc}$ (mV) | $R_s$ (ohm) | FF (%) | Eff. (%) |
|---|---|---|---|---|---|
| Comparative Example 1 | 8.716 | 626.5 | 0.0058 | 77.49 | 17.37 |
| Comparative Example 2 | 8.710 | 626.3 | 0.0059 | 77.30 | 17.35 |
| Comparative Example 3 | 8.726 | 625.7 | 0.0063 | 76.78 | 17.27 |
| Example 1 | 8.720 | 627.1 | 0.0056 | 77.52 | 17.41 |
| Example 2 | 8.706 | 627.2 | 0.0058 | 77.47 | 17.39 |

Referring to Table 2, the solar cells according to Examples 1 and 2 showed all satisfactory electrical characteristics ($V_{oc}$, $R_s$ fill factor (FF, %), conversion efficiency (Eff., %)) according to the solar cells according to Comparative Examples 1 to 3. In particular, the finger electrode and the bus electrode pattern formed using a composition for forming an electrode including a glass fit including silver (Ag) and phosphorus (P) according to Comparative Example 3 exhibited decreased $V_{oc}$ and increased $R_s$ and thus deteriorated efficiency.

By way of summation and review, a solar cell may have high efficiency by decreasing factors that deteriorate efficiency. The efficiency of the solar cell may be deteriorated by, e.g., an optical loss, a recombination loss of electron and holes, and loss by a resistance component. For example, optical loss may be caused by not using 100% of incident light entering the solar cell, and may be caused by a shadow loss due to a front electrode.

Light absorption rate may be increased by decreasing a thickness of the front electrode, but may increase series resistance due to line breaking of an electrode pattern when the thickness is simply decreased.

The embodiments may provide a method of forming an electrode capable of improving efficiency of a solar cell by minimizing a thickness of an electrode pattern without increasing series resistance ($R_s$).

The method of forming an electrode according to an embodiment may improve efficiency of a solar cell by increasing a thickness of the electrode at most without increasing series resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming an electrode, the method comprising:
    forming a pattern of a finger electrode by:
        coating a composition for forming a first electrode that includes a conductive powder, an organic vehicle, and a first glass frit that is free of silver and phosphorus, and
        drying the coated composition for forming a first electrode;
    forming a pattern of a bus electrode by:
        coating a composition for forming a second electrode that includes a conductive powder, an organic vehicle, and a second glass frit that includes silver and phosphorus, and
        drying the coated composition for forming a second electrode; and
    firing the resultant patterns.

2. The method of forming an electrode as claimed in claim 1, wherein the composition for forming the first electrode includes:
    about 60 wt % to about 95 wt % of the conductive powder,
    about 0.5 wt % to about 20 wt % of the first glass fit, and
    a balance amount of the organic vehicle.

3. The method of forming an electrode as claimed in claim 1, wherein the composition for forming the second electrode includes:
    about 60 wt % to about 95 wt % of the conductive powder,
    about 0.5 wt % to about 20 wt % of the second glass fit, and
    a balance amount of the organic vehicle.

4. The method of forming an electrode as claimed in claim 1, wherein the second glass frit includes:
    about 0.1 mol % to about 5 mol % of silver, and
    about 0.1 mol % to about 3 mol % of phosphorus, all mol % being based on a total amount of the second glass frit.

5. The method of forming an electrode as claimed in claim 1, wherein the second glass fit further includes tellurium and lithium.

6. The method of forming an electrode as claimed in claim 5, wherein the second glass frit includes:
    about 30 mol % to about 60 mol % of tellurium, and
    about 3 mol % to about 20 mol % of lithium, all mol % being based on a total amount of the second glass frit.

7. The method of forming an electrode as claimed in claim 5, wherein the second glass frit has a mole ratio of tellurium to lithium of about 80:20 to about 95:5.

8. The method of forming an electrode as claimed in claim 5, wherein the second glass frit further includes bismuth, lead, or a combination thereof.

9. An electrode for a solar cell manufactured according to the method as claimed in claim 1.

10. A solar cell comprising the electrode as claimed in claim 9.

* * * * *